(12) United States Patent
Spesser et al.

(10) Patent No.: US 11,364,810 B2
(45) Date of Patent: Jun. 21, 2022

(54) MONITORING DEVICE FOR LEAKAGE CURRENTS

(71) Applicant: Dr. Ing. h.c. F. Porsche Aktiengesellschaft, Stuttgart (DE)

(72) Inventors: Daniel Spesser, Illingen (DE); Tim Pfizenmaier, Leonberg (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 84 days.

(21) Appl. No.: 17/068,984

(22) Filed: Oct. 13, 2020

(65) Prior Publication Data

US 2021/0107367 A1    Apr. 15, 2021

(30) Foreign Application Priority Data

Oct. 14, 2019  (DE) ...................... 10 2019 127 579.2

(51) Int. Cl.
*B60L 53/30* (2019.01)
*B60L 53/22* (2019.01)
*B60L 3/00* (2019.01)

(52) U.S. Cl.
CPC ............. *B60L 53/30* (2019.02); *B60L 3/0069* (2013.01); *B60L 53/22* (2019.02)

(58) Field of Classification Search
CPC ........ B60L 53/30; B60L 3/0069; B60L 53/22; G01R 31/40; G01R 31/52; H02J 7/0029; H02J 2310/48; Y02T 10/70; Y02T 10/7072; Y02T 90/12; Y02T 90/14

USPC ........................................................ 320/109
See application file for complete search history.

(56) References Cited

U.S. PATENT DOCUMENTS

| | | | |
|---|---|---|---|
| 9,696,743 | B1 | 7/2017 | Treichler et al. |
| 10,139,848 | B1 | 11/2018 | Treichler et al. |
| 2010/0131215 | A1 | 5/2010 | Kim |
| 2013/0176650 | A1 | 7/2013 | Ripoll et al. |
| 2013/0301168 | A1 | 11/2013 | Ploix et al. |
| 2014/0043880 | A1* | 2/2014 | Nuss ..................... H02H 3/33 363/95 |
| 2014/0210411 | A1 | 7/2014 | Fluxa et al. |
| 2014/0333129 | A1 | 11/2014 | Ripoll et al. |
| 2015/0168481 | A1* | 6/2015 | Hackl ................... G01R 31/52 324/551 |

* cited by examiner

*Primary Examiner* — Paul Dinh
(74) *Attorney, Agent, or Firm* — RatnerPrestia

(57) ABSTRACT

A monitoring device for monitoring leakage currents at active conductors has a differential current measurement device, a signal generation device and a control device, which differential current measurement device is designed to record a first signal (I_DIFF) characterizing the differential current of the active conductors and to feed the first signal to the control device. The signal generation device is designed to generate at least one second signal (V_GRID) and to feed the second signal to the control device, which at least one second signal (V_GRID) includes information about the phase angle of a signal occurring at one of the active conductors. The control device is designed to generate a third signal (I_LC_RES) on the basis of the first signal (I_DIFF) and of the at least one second signal (V_GRID), which third signal characterizes the resistive leakage current.

14 Claims, 5 Drawing Sheets

MONITORING DEVICE FOR LEAKAGE CURRENTS

CROSS-REFERENCE TO RELATED APPLICATION

This application claims priority to German Patent Application No. 10 2019 127 579.2, filed Oct. 14, 2019, the content of such application being incorporated by reference herein in its entirety.

FIELD OF THE INVENTION

The invention relates to a monitoring device for monitoring leakage currents, in particular for use in the charger of a vehicle.

BACKGROUND OF THE INVENTION

Leakage currents are electric currents that flow in an undesired current path under normal operating conditions, for example from one of the phase conductors (L1 to L3) to protective earth (PE). Such leakage currents in practice occur in particular as a result of filter capacitors of a grid filter that are connected to a DC voltage path on one side and to protective earth (PE) on the other side. Leakage currents may also occur in the case of insulation faults and in the case of AC current consumers, such as air conditioning compressors or active chassis.

Each of the cited references identified hereinafter is incorporated by reference in its entirety.

US 2014/0210411 A1 and U.S. Pat. No. 9,696,743 B1 disclose a charging circuit of a vehicle having leakage current compensation.

US 2014/0333129 A1 discloses a device for compensating high-frequency leakage currents.

US 2013/0301168 A1 discloses a device for limiting currents that may occur upon coming into contact with a conductive component.

US 2013/0176650 A1 discloses a device for limiting leakage currents.

SUMMARY OF THE INVENTION

Described herein is a monitoring device for monitoring leakage currents and a vehicle having such a monitoring device.

A monitoring device for monitoring leakage currents at active conductors has a differential current measurement device, a signal generation device and a control device, which differential current measurement device is designed to record a first signal characterizing (e.g., being representative of) the differential current of the active conductors and to feed said first signal to the control device, which signal generation device is designed to generate at least one second signal and to feed said second signal to the control device, which at least one second signal comprises information about the phase angle of a signal occurring at one of the active conductors, and which control device is designed to generate a third signal on the basis of the first signal and of the at least one second signal, which third signal characterizes the resistive leakage current. The active conductors are designed to be connected to a power grid by way of at least one phase conductor. Generating a third signal characterizing the resistive leakage current makes it possible to monitor the electrical properties at the active conductors and thus to increase the safety of the overall device.

According to one preferred embodiment, the control device is designed to compare the third signal with a predefined first limit value and then to generate a fault signal when the third signal corresponds to a resistive leakage current that is greater than the resistive leakage current corresponding to the first limit value. Generating a fault signal makes it possible to provide information to a user or to bring about a response of the device, and thus increases the safety of the overall device.

According to one preferred embodiment, the control device has an output interface and is designed to output the fault signal via the output interface. The output enables a display or a response.

According to one preferred embodiment, the control device is designed to predefine the first limit value on the basis of the second signal. The second signal contains information about the supply grid connected to the active conductors, and the first limit value may therefore be predefined on the basis of the supply grid. As a result, a larger resistive leakage current may be permitted in some countries than in other countries, and the monitoring device is able to make good use of the respective supply grid.

According to one preferred embodiment, the signal generation device has at least one voltage measurement device and is designed to use the at least one voltage measurement device to generate a signal characterizing the voltage at the active conductor and to feed said signal to the control device as second signal. Measuring the voltage allows a good determination of the phase angle.

According to one preferred embodiment, the signal generation device has at least one current measurement device and is designed to use the at least one current measurement device to generate a signal characterizing the current at the active conductor and to feed said signal to the control device as second signal. Measuring the current likewise makes it possible to determine the phase angle. Good use is able to be made of the current in particular in the case of circuits with reactive power compensation.

According to one preferred embodiment, the control device is designed to define the phase position of the first signal in relation to the second signal and, in order to define the third signal, to determine that component of the first signal that is in phase with the second signal. In order to be defined, the first signal is thus possibly divided into a resistive and a capacitive component.

According to one preferred embodiment, the control device is designed to determine a first phase angle from the first signal and to determine at least one second phase angle from the at least one second signal. Taking into account the phase angle makes the evaluation easier.

According to one preferred embodiment, the control device is designed to define whether a resistive leakage current is present on the basis of the phase angle difference between the first phase angle and the at least one second phase angle.

According to one preferred embodiment, the control device is designed to determine the third signal on the basis of the product of the first signal and the at least one second signal. This is a further evaluation option in which the first signal is weighted on the basis of the second signal.

According to one preferred embodiment, the signal generation device is designed to generate at least two second signals and to feed said second signals to the control device, and the control device is designed to generate the third signal on the basis of the at least two second signals. By virtue of taking into account a plurality of second signals, it is advantageously possible to check, in the case of supply grids having a plurality of phase connections, whether the measured leakage current is resistive, capacitive or mixed in relation to one or more phase connections.

According to one preferred embodiment, the control device is designed, when generating the third signal, to perform a respective individual comparison between the first signal and a first of the at least two second signals and to check whether a resistive leakage current is present with regard to this first second signal. The individual evaluation leads to a comparatively accurate result.

According to one preferred embodiment, the control device is designed to generate a fourth signal from the first signal and from the second signal, which fourth signal characterizes the capacitive leakage current. In addition to the resistive leakage current, the capacitive leakage current is therefore also determined, and it is possible to respond accordingly.

According to one preferred embodiment, the monitoring device has an amplifier and a feeder device, which amplifier is designed to generate a compensation current on the basis of the fourth signal, and which feeder device is designed to allow the compensation current to be fed in at at least one of the active conductors. The compensation current is thus preferably influenced on the basis of the capacitive leakage current, since this also occurs during normal operation and does not necessarily indicate a fault.

A vehicle has a charger for a traction battery, which charger has a rectifier and a traction battery connected directly or indirectly to the rectifier, wherein the traction battery is coupled galvanically to the active conductors, and wherein the charger has a monitoring device.

As a result of the galvanic coupling, leakage currents in the charger are also noticeable on the grid supply side and may for example lead to tripping of a fault current protection switch. The monitoring device is therefore particularly advantageous in such a vehicle.

BRIEF DESCRIPTION OF THE DRAWING FIGURES

Further details and advantageous refinements of the invention will emerge from the exemplary embodiments described below and illustrated in the drawings, which embodiments should in no way be understood as restricting the invention, and also from the dependent claims. In the figures:

Figure 1:
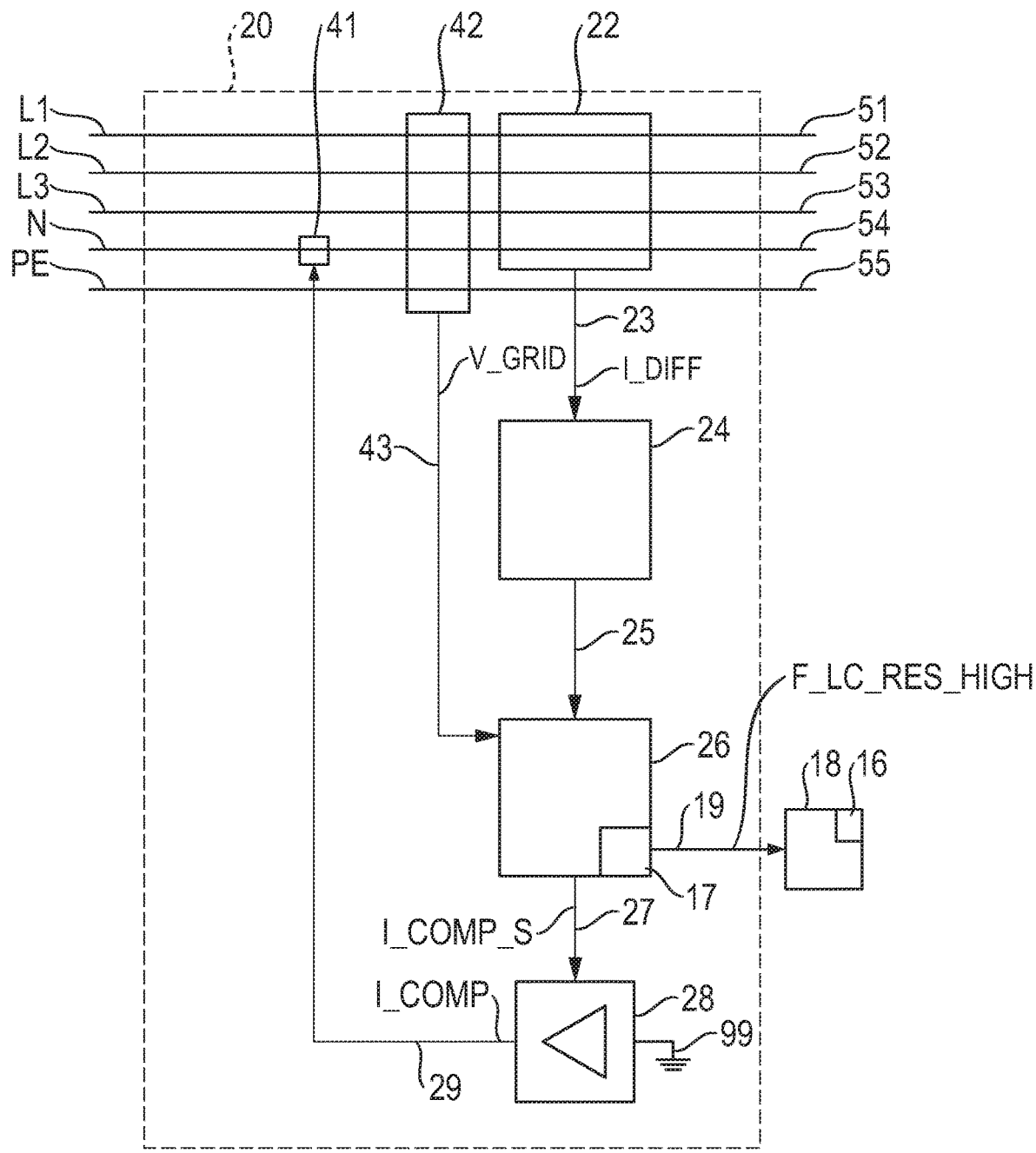
FIG. 1 shows an exemplary embodiment of a monitoring device.
Figure 3:
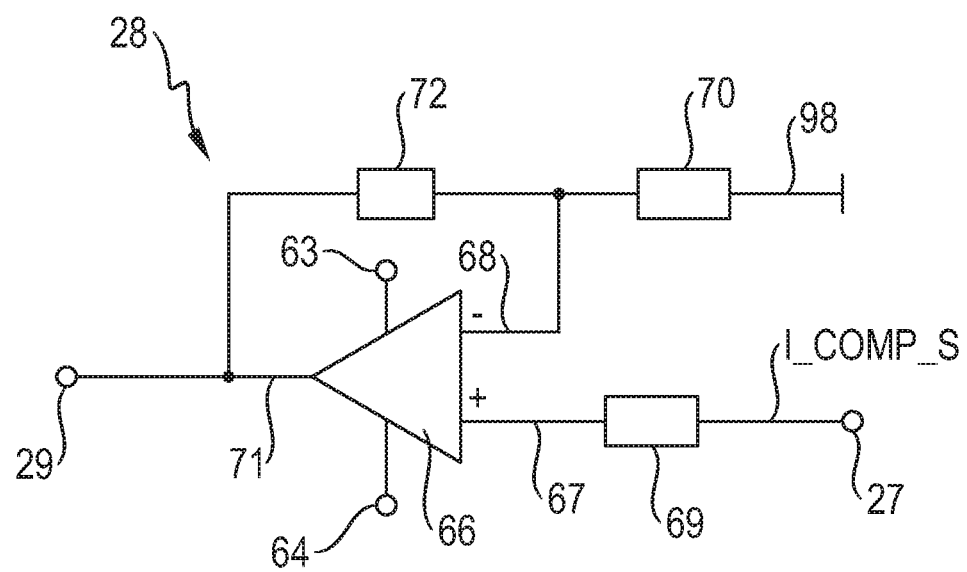
Figure 4:
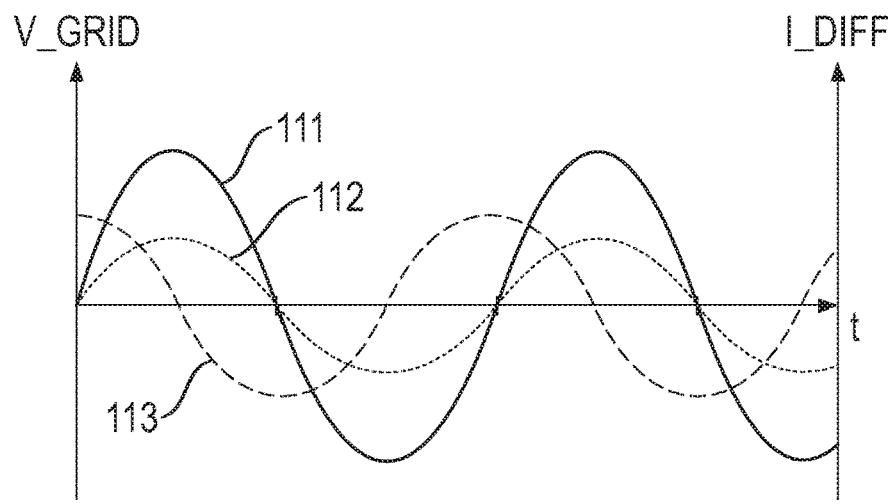
Figure 5:
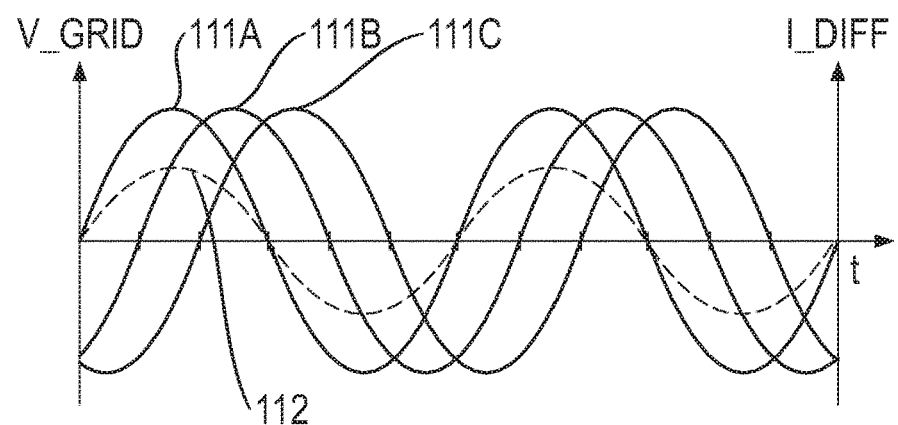
Figure 6:
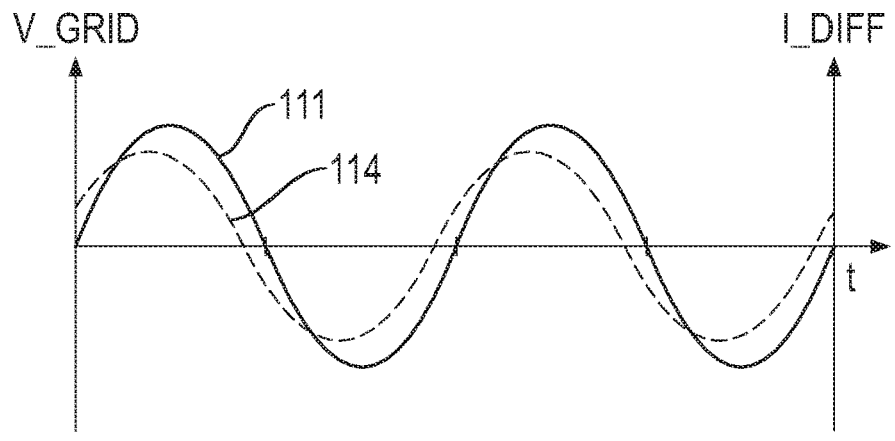
Figure 7:
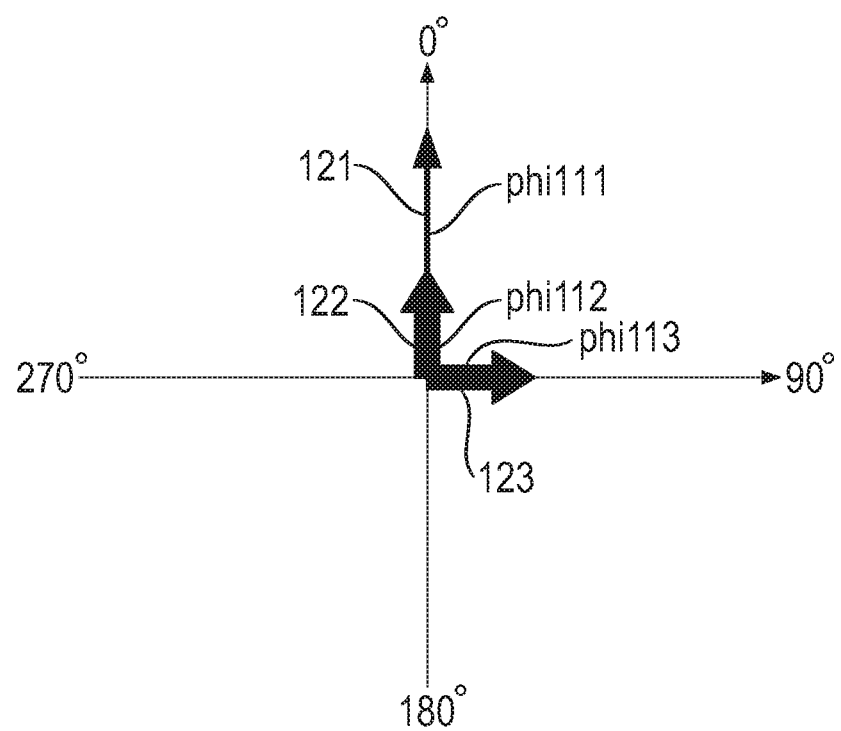
Figure 8:
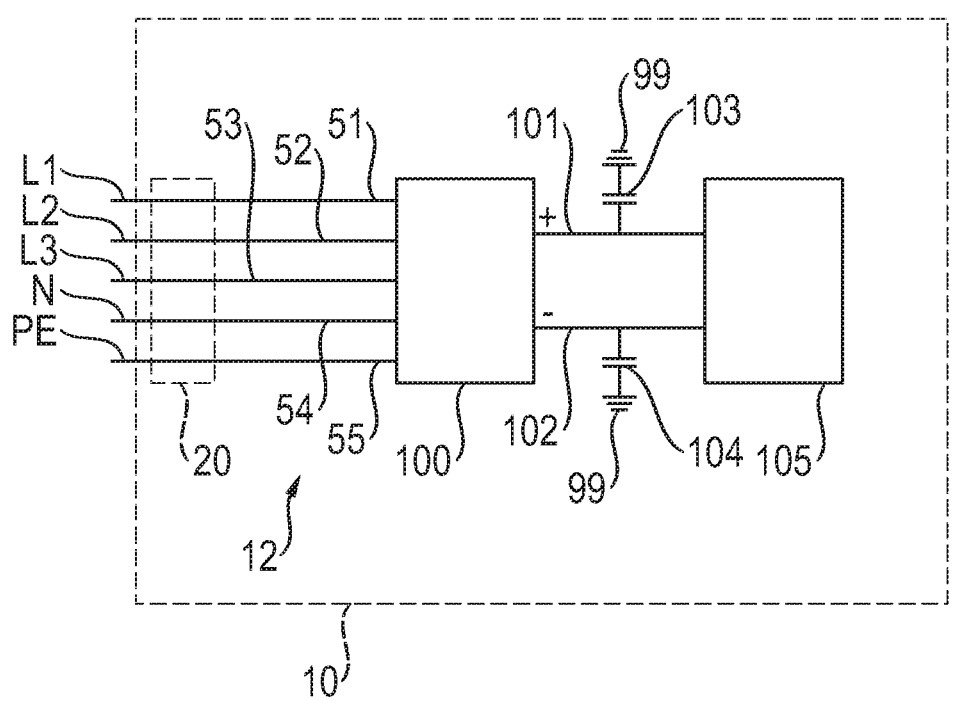

FIG. 3 shows an exemplary embodiment of an amplifier of the monitoring device of FIG. 1, FIG. 4 shows an exemplary embodiment of the temporal profiles of an input voltage, of a resistive and of a capacitive leakage current, FIG. 5 shows an exemplary embodiment of the temporal profiles of three input voltages and of a resistive leakage current, FIG. 6 shows an exemplary embodiment of the temporal profiles of an input voltage and of a leakage current with a resistive and capacitive component, FIG. 7 shows a rotating phasor diagram of the phase angle of an input voltage, of a resistive and of a capacitive leakage current at a predefined time, and FIG. 8 shows an application of the monitoring device from FIG. 1 in a vehicle.

DETAILED DESCRIPTION OF THE INVENTION

FIG. 1 shows an exemplary embodiment of a monitoring device 20. Five conductors 51, 52, 53, 54 and 55 are provided. In the case of a three-phase current grid, the conductors 51 to 53 may be connected for example to the phase conductors (phases) L1, L2 and L3. The conductor 54 is connected to the neutral conductor N, and the conductor 55 is connected to protective earth PE. The conductors 51, 52, 53, 54 required for the current line A differential current measurement device 22 measures the differential current of the active conductors 51 to 54. The differential current measurement device 22 may for example be designed as a summation current transformer in the form of a winding around the active conductors 51 to 54. If no fault currents or leakage currents occur, the sum of the currents through the conductors 51 to 54 and therefore also the current through the winding is zero. If on the other hand for example a leakage current flows through a Y capacitor of a grid filter from the phase L1 to protective earth PE, the differential current measurement device 22 gives the resultant differential current. It is also possible for example to separately measure the summation current through the conductors 51 to 53, on the one hand, and through the conductor 54, on the other hand, and then to calculate the sum of or difference between the two values on the basis of the respective winding direction. The signal I_DIFF from the differential current measurement device 22 is fed to a signal processing device 24 via a line 23. An analog-to-digital conversion is performed for example in the signal processing device 24. The signal processing device 24 transmits a corresponding signal via a line 25 to a control device 26, which is designed for example as a microcontroller or as a computing unit.

The control device 26 may generate a value or a signal I_COMP_S for a suitable compensation current on the basis of the determined differential current I_DIFF and/or output a fault signal F_LC_RES_HIGH via an output interface 17 and a line 19, as will be explained in more detail below. The line 19 is connected for example to an output device 18 that has a display 16. The display 16 may be used to display corresponding information about the differential current I_DIFF or about the fault signal F_LC_RES_HIGH to a user. The output device 18 may be designed to deactivate a consumer connected to the lines 51 to 54 when a fault signal occurs, for example by interrupting a charging procedure of a traction battery.

The value I_COMP_S is fed to an amplifier 28 via a line 27, and the amplifier 28 generates a corresponding compensation current I_COMP. To this end, the amplifier 28 is connected to protective earth 99 in order to allow a current from or to protective earth 99. The amplifier 28 is connected to a feeder device 41 via a line 29. The compensation current I_COMP may be fed in via the feeder device 41. If, as in the exemplary embodiment, a neutral conductor is present, feeding in is preferably performed into the neutral conductor. If on the other hand—such as for example in the case of a split-phase grid as is common in the USA—no neutral conductor is provided, feeding in is preferably performed into one of the phase conductors. The feeder device 41 may perform the feeding in for example through a capacitive coupling or through an inductive coupling.

A first signal generation device 42 is provided in order to generate at least one signal V_GRID that comprises information about the phase angle of a signal occurring at an associated active conductor of the active conductors 51 to 54. The signal V_GRID is fed to the control device 26 via a line 43.

To this end, the signal generation device 42 measures for example the voltages at the terminals 51 to 54 with respect to the potential at the neutral conductor N or at protective earth PE. The signal generation device 42 preferably has a voltage measurement device by way of which it is possible to generate the signal characterizing the voltage at the associated active conductor 51, 52, 53, 54.

As an alternative or in addition, the signal generation device 42 has at least one current measurement device and is designed to use the at least one current measurement device to generate a signal characterizing the current at the active conductor 51, 52, 53, 54 and to feed said signal to the control device 26 as second signal V_GRID.

Figure 2:
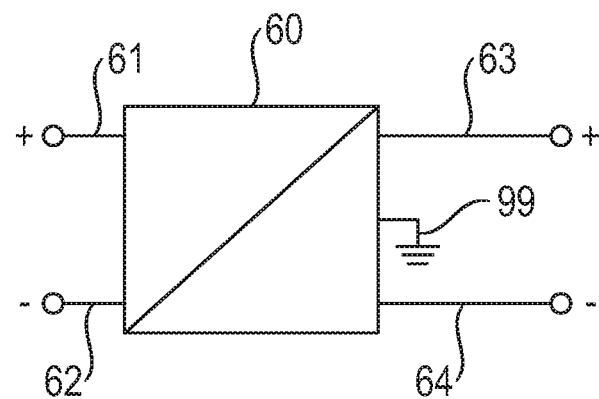
FIG. 2 shows a power supply for a compensation current.

FIG. 2 shows a power supply 60 for generating a DC voltage at the outputs 63, 64 from a DC voltage at the inputs 61, 62. The voltage between the inputs 61, 62 is for example 12 V. The voltage at the output 63 is for example +15 V and the voltage at the output 64 is −15 V. The power supply 60 is connected to protective earth 99 in order to allow a potential reference thereto.

FIG. 3 shows an exemplary embodiment of the amplifier 28. The amplifier 28 is designed as a differential amplifier in the exemplary embodiment, and it has an operational amplifier 66 having a positive (non-inverting) input 67 and a negative (inverting) input 68, and an output 71. For voltage supply purposes, the operational amplifier 66 is connected to the terminals 63 and 64 of the power supply 60 of FIG. 2. The line 27 is connected to the positive input 67 via a resistor 69. The negative input 68 is connected to ground (GND) 98 via a resistor 70. The negative input 68 is additionally connected to the output 71 via a resistor 72. The output 71 is connected to the line 29. The gain of the amplifier 28 has to be selected on the basis of the signal I_COMP_S, and a gain by a factor of 10 has been used in the exemplary embodiment.

By way of example but without restriction, the following component values are given:
Resistor 69 13 kohm
Resistor 70 330 ohm
Resistor 72 3300 ohm As an alternative to the amplifier that is shown, a digital-to-analog converter or a class D amplifier is possible.

Various types of leakage currents are considered in more detail in the following figures and the associated description.

Leakage currents may be caused by different circuits or faults. They may occur in the form of capacitive leakage currents and in the form of resistive leakage currents.

FIG. 4 shows a graph in which firstly the signal 111 (V_GRID) generated by the signal generation device 42 (cf. FIG. 1) and secondly a signal 112 resulting from a resistive leakage current and a signal 113 resulting from a capacitive leakage current are shown, each plotted against time t. The signal 112 characterizing the resistive leakage current may be denoted I_LC_RES, and the signal 113 characterizing the capacitive leakage currents 113 may be denoted I_COMP_S (cf. FIG. 1).

Resistive leakage currents are normally in phase (0° phase shift) or—rarely—in phase opposition (180° phase shift) with respect to the phase L1 or with respect to at least one of the phases L1 to L3. Capacitive leakage currents usually have a phase shift of 90° with respect to the phase L1 or with respect to at least one of the phases L1 to L3.

The signal V_GRID corresponds for example to the profile of the voltage of a phase L1 in the case of a single-phase or three-phase supply grid. Such signals V_GRID often have a comparatively high amplitude of for example 120 V.

The leakage currents usually have an amplitude of a few milliamperes, and the signals 112, 113 may for example be generated in amplified or non-amplified form by an analog-to-digital converter.

Capacitive leakage currents occur for example as a result of grid filters in which what are known as Y capacitors are connected between a path of a DC voltage intermediate circuit and protective earth PE in order to improve electromagnetic compatibility (EMC).

Resistive leakage currents may occur for example in the case of an insulation fault or in the case of AC current consumers such as air conditioning compressors or an active chassis. Resistive leakage currents should not occur in certain application cases. By way of example, in a procedure of charging an electric vehicle at a charging column, the electric drive motor is usually deactivated. The electric drive motor should not generate any resistive leakage currents. It has therefore proved to be advantageous not to compensate resistive leakage currents, but rather to monitor them. In the case of a limit value I_LC_RES MAX being exceeded, a fault case may be assumed and a fault signal F_LC_RES_HIGH may be output via the output interface 17, cf. FIG. 1. The limit value I_LC_RES MAX may be exceeded for example by virtue of a comparison of the signal I_LC_RES with the limit value I_LC_RES MAX.

The limit value I_LC_RES MAX is preferably defined on the basis of the second signal V_GRID. It is able to be determined for example from the second signal V_GRID whether a "split-phase" US supply grid is present, or a three-phase current grid having a voltage of in each case 230 V. It is thereby possible to at least approximately determine the country or region in which the monitoring device 20 is located. This allows country-specific parameterization. By way of example, a maximum differential current I_DIFF of 20 mA is permitted in the USA in the case of the split-phase grid, and a maximum of 30 mA is permitted in Europe.

As a result of the fault signal, the charging procedure of an electric vehicle may for example be interrupted, and/or a fault signal may be output via the output interface 17 of FIG. 1.

It is comparatively easy to distinguish between a capacitive leakage current and a resistive leakage current as long as only one of these leakage currents is present.

The signal 112 resulting from the resistive leakage current is in phase with the signal V_GRID 111, and the extrema (maxima and minima) and the zero-crossings of the two signals 111, 112 occur at the same time t.

In such a case, the amplitude of the signal 112, or the integral over the absolute value of the signal 112 over a period, or the integral over the square of the signal 112 over a period may be used as the signal I_LC_RES characterizing the resistive leakage current.

The capacitive leakage current 113 usually has a phase shift of 90° with respect to the signal V_GRID 111, since the current is proportional to the differential of the voltage. An extremum of the signal V_GRID 111 and a zero-crossing of the capacitive leakage current 113 therefore always occur temporally at the same time t.

In such a case, the amplitude of the signal 113, or the integral over the absolute value of the signal 113 over a period, or the integral over the square of the signal 113 over a period may be used as the signal I_COMP_S characterizing the capacitive leakage current.

In addition to the main frequencies that are in the region of the grid frequency, harmonics may also occur. For the purpose of better evaluation, a frequency filter is preferably applied to the signal V_GRID in order to filter out interfering frequency ranges.

FIG. 5 shows a further graph in which the signal V_GRID generated by the signal generation device 42 from FIG. 1 and a signal 112 resulting from a resistive leakage current are shown, each against time t.

The signal V_GRID by way of example has three sinusoidal voltage profiles 111A for a phase L1, 111B for a phase L2 and 111C for a phase L3. In the case of a three-phase grid connection, the phases each have a phase shift of 120° with respect to one another, that is to say 0°, 120° and 240°.

The leakage current is unambiguously a resistive leakage current since the signal 112 is in phase with the voltage profile 111A of the phase L. The extrema and the zero-crossings each occur at the same time. An unambiguous association is thus possible, and the evaluation may be performed as explained above with the signal 112 as the signal I_LC_RES characterizing the resistive leakage current.

It is likewise readily possible to evaluate leakage currents that, although they are dependent on the voltage profile of a plurality of the phases L1, L2, L3, are either only capacitive or only resistive. Such capacitive or resistive leakage currents have a correspondingly higher frequency.

FIG. 6 shows a graph with a signal V_GRID 111 and a leakage current I_DIFF 114, plotted against time t.

The leakage current I_DIFF 114 has the same frequency as the signal V_GRID 111, but it has a phase shift neither of 0° nor of 90°. In the case of a single-phase grid, it may thus be concluded that both capacitive and resistive leakage currents are present. Superimposing two sinusoidal oscillations having the same frequency and different phases (not 0° or 180°) again gives a sinusoidal oscillation with a phase shift. A signal I_LC_RES characterizing the resistive component and a signal I_COMP_S characterizing the capacitive component of the leakage current may therefore be calculated.

FIG. 7 shows an illustration of the phase angle of the sinusoidal oscillations that occur. The angular range from 0° to 360° for one period is illustrated. The arrow 121 corresponds to the signal 111 of FIG. 4, the arrow 122 corresponds to the signal 112 and the arrow 123 corresponds to the signal 113, each at a time at which the signal 111 of FIG. 4 is at a maximum. It is able to be seen clearly when observing the respective phase angle that the arrow 122 indicates the resistive leakage current and the arrow 123 indicates the capacitive leakage current. It is also possible to calculate components consisting of mixed leakage currents from this observation. The arrows 121, 123, 124 rotate over time.

One option for calculating a signal I_LC_RES characterizing the resistive leakage current and a signal I_COMP_S characterizing the capacitive leakage current is given by the illustration of FIG. 7. The resistive leakage current corresponds to that component of the leakage current that is parallel to the arrow or vector 121 (in phase), and the capacitive leakage current corresponds to that component of the leakage current that is perpendicular to the arrow or vector 121.

The signal I_COMP_S for the compensation current I_COMP is calculated for example by determining the frequency spectrum of the differential current or of the signal I_DIFF, wherein a frequency range from 20 Hz to 300 kHz may be sufficient. The frequency spectrum contains corresponding amplitudes, and the signal I_COMP_S is generated with a phase shift of 180° (phase opposition) in order to bring about corresponding compensation. Other calculations in which the integral is calculated are also possible.

FIG. 8 shows an exemplary embodiment of the use of the conductors 51 to 55 with the schematically illustrated monitoring device 20 in a vehicle 10, in particular in an electric vehicle or a hybrid vehicle. The conductors 51 to 53 (phase conductors), 54 (neutral conductor) and the conductor 55 (protective earth) are connected to a rectifier (AC-to-DC converter) 100, and provided at the output of the rectifier 100 are two conductors 101 (+) and 102 (−) at which a DC voltage is present. The arrangement may thus serve as a charger 12. The conductor 101 is connected to protective earth 99 via a capacitor 103, and the conductor 102 is connected to protective earth 99 via a capacitor 104. The conductors 101, 102 are connected directly or indirectly (for example via an additional DC-to-DC converter) to a consumer 105, for example a traction battery. The capacitors 103, 104 act as EMC filters or grid filters and are also referred to as Y capacitors or filter capacitors.

A capacitive current may flow through the capacitors 103, 104 to protective earth 99 (PE) during operation. Since the voltage at the conductors 101, 102 is generated via the current through the active conductors L1, L2, L3 and N, the capacitive leakage current to protective earth 99 leads to a differential current in the active conductors that, when it exceeds a predefined limit value, may lead to tripping of a fuse or of a fault current protection switch of the supply connection. Normal limit values of fuses in supply grids are for example 5 mA or 20 mA or 30 mA.

The resistive leakage currents and capacitive leakage currents may be monitored by the monitoring device 20, and it is possible to respond accordingly.

The resistive leakage currents or a corresponding fault signal may be displayed, and/or interruption of a charging procedure may be initiated when a limit value is exceeded.

The capacitive leakage currents may be compensated to the extent that the fuse of the supply grid does not trip during normal operation on account of the limit value for leakage currents being exceeded. In addition or as an alternative, it is likewise possible to display the capacitive leakage currents or an exceeding of a limit value.

Providing the monitoring device 20 is advantageous in particular in the case of chargers 12 for electric vehicles or hybrid vehicles that have galvanic coupling between the DC current intermediate circuit 101, 102 and the conductors 51 to 54 or between the consumer 105 and the conductors 51 to 54. Unlike in the case of vehicles having galvanic isolation, as may be the case for example in the case of vehicles having transformers in the rectifier 100 or in a DC-to-DC converter, the leakage currents add together in the case of galvanic coupling and are visible on the supply grid. Using the monitoring device 20 is therefore particularly advantageous in the case of vehicles having galvanic coupling.

Numerous variations and modifications are of course possible within the scope of the present invention.

The circuits that are shown specifically, in addition to the claimed elements, contain further elements for increasing safety or for further functionalities. Each of these elements described in the text may constitute a preferred development on its own and may as such preferably be used on its own.

What is claimed:

1. A monitoring device for monitoring leakage currents at active conductors, which active conductors are configured to be connected to a power grid by way of at least one phase conductor, said monitoring device comprising:
   a control device;
   a differential current measurement device configured to record a first signal (I_DIFF) characterizing a differential current of the active conductors and to feed said first signal to the control device;
   a signal generation device configured to generate at least one second signal (V_GRID) and to feed said second signal to the control device, which at least one second signal (V_GRID) comprises information about a phase angle of a signal occurring at one of the active conductors; and
   an amplifier and a feeder device,
   wherein the amplifier is configured to generate a compensation current (I_COMP) on the basis of the fourth signal (I_COMP_S),
   wherein the feeder device is configured to allow the compensation current to be fed in at least one of the active conductors,
   wherein the control device is configured to generate a third signal (I_LC_RES) on the basis of the first signal (I_DIFF) and of the at least one second signal (V_GRID), which third signal characterizes a resistive leakage current, and
   wherein the control device is configured to generate a fourth signal (I_COMP_S) from the first signal (I_DIFF) and from the second signal (V_GRID), which fourth signal characterizes the capacitive leakage current.

2. The monitoring device as claimed in claim 1, wherein the control device is configured to compare the third signal (I_LC_RES) with a predefined first limit value (I_LC_RES_MAX) and then generate a fault signal (F_LC_RES_HIGH) when the third signal (I_LC_RES) corresponds to a resistive leakage current that is greater than the resistive leakage current corresponding to the first limit value (I_LC_RES_MAX).

3. The monitoring device as claimed in claim 2, wherein the control device has an output interface and is configured to output the fault signal (F_LC_RES_HIGH) via the output interface.

4. The monitoring device as claimed in claim 2, wherein the control device is configured to predefine the first limit value (I_LC_RES_MAX) on the basis of the second signal (V_GRID).

5. The monitoring device as claimed in claim 1, wherein the signal generation device has at least one voltage measurement device and is configured to use the at least one voltage measurement device to generate a signal characterizing the voltage at the active conductor and to feed said signal to the control device as the second signal (V_GRID).

6. The monitoring device as claimed in claim 1, wherein the signal generation device has at least one current measurement device and is configured to use the at least one current measurement device to generate a signal characterizing a current at the active conductor and to feed said signal to the control device as the second signal (V_GRID).

7. The monitoring device as claimed in claim 1, wherein the control device is configured to define a phase position of the first signal (I_DIFF) in relation to the second signal (V_GRID) and, in order to define the third signal (I_LC_RES), to determine that component of the first signal (I_DIFF) that is in phase with the second signal (V_GRID).

8. The monitoring device as claimed in claim 1, wherein the control device is configured to determine a first phase angle (phi112; phi113) from the first signal (I_DIFF) and to determine at least one second phase angle (phi111) from the at least one second signal (V_GRID).

9. The monitoring device as claimed in claim 8, wherein the control device is configured to define whether a resistive leakage current is present on the basis of the phase angle difference between the first phase angle (phi112; phi113) and the at least one second phase angle (phi111).

10. The monitoring device as claimed in claim 1, wherein the control device is configured to determine the third signal on the basis of a product of the first signal (I_DIFF) and the at least one second signal (V_GRID).

11. The monitoring device as claimed in claim 1, wherein the signal generation device is configured to generate at least two second signals (V_GRID) and to feed said second signals to the control device, and wherein the control device is configured to generate the third signal (I_LC_RES) on the basis of the at least two second signals (V_GRID).

12. The monitoring device as claimed in claim 11, wherein the control device is configured, when generating the third signal (I_LC_RES), to perform a respective individual comparison between the first signal (I_DIFF) and a first of the at least two second signals (V_GRID) and to check whether a resistive leakage current is present with regard to the first second signal (V_GRID).

13. A vehicle having a charger for a traction battery, which charger has a rectifier and a traction battery connected directly or indirectly to the rectifier, wherein the traction battery is coupled galvanically to the active conductors, and wherein the charger includes the monitoring device as claimed in claim 1.

14. A monitoring device for monitoring leakage currents at active conductors, which active conductors are configured to be connected to a power grid by way of at least one phase conductor, said monitoring device comprising:
   a control device;
   a differential current measurement device configured to record a first signal (I_DIFF) characterizing a differential current of the active conductors and to feed said first signal to the control device; and
   a signal generation device configured to generate at least two second signals (V_GRID) and to feed said second signals to the control device, which each second signal (V_GRID) comprises information about a phase angle of a signal occurring at one of the active conductors,
   wherein the control device is configured to generate a third signal (I_LC_RES) on the basis of the first signal (I_DIFF) and of the at least two second signals (V_GRID), which third signal characterizes a resistive leakage current,
   wherein the control device is configured, when generating the third signal (I_LC_RES), to perform a respective individual comparison between the first signal (I_DIFF) and a first of the at least two second signals (V_GRID) and to check whether a resistive leakage current is present with regard to the first second signal (V_GRID).

* * * * *